United States Patent [19]

Lautzenhiser et al.

[11] Patent Number: 5,680,814
[45] Date of Patent: Oct. 28, 1997

[54] SQUEEGEE DEVICE FOR SCREEN PRINTING PROCESSES

[75] Inventors: Frans Peter Lautzenhiser, Noblesville; James Edward Walsh, W. Lafayette, both of Ind.

[73] Assignee: Delco Electronics Corp., Kokomo, Ind.

[21] Appl. No.: 603,143

[22] Filed: Feb. 20, 1996

[51] Int. Cl.$^6$ ........................................ B41F 15/44
[52] U.S. Cl. ................................. 101/123; 101/124
[58] Field of Search ............................... 101/114, 120, 101/123, 124, 129, 484

[56] References Cited

U.S. PATENT DOCUMENTS

| | | | |
|---|---|---|---|
| 3,071,069 | 1/1963 | Sherman | 101/123 |
| 3,742,902 | 7/1973 | Heston | 101/124 |
| 3,980,017 | 9/1976 | Black | 101/129 |
| 4,122,771 | 10/1978 | Barton et al. | 101/124 |
| 4,665,822 | 5/1987 | Plesinger et al. | 101/123 |
| 4,817,524 | 4/1989 | Riemer | 101/123 |
| 4,989,512 | 2/1991 | Lindstrom et al. | 101/123 |
| 5,027,703 | 7/1991 | Hancy | 101/123 |
| 5,273,780 | 12/1993 | Borger et al. | 101/129 |
| 5,309,837 | 5/1994 | Nanzai | 101/129 |
| 5,448,948 | 9/1995 | Somers et al. | 101/123 |

FOREIGN PATENT DOCUMENTS

| | | | |
|---|---|---|---|
| 836793 | 4/1952 | Germany | 101/120 |
| 159416 | 3/1983 | Germany | 101/123 |
| 49989 | 3/1985 | Japan | 101/120 |

*Primary Examiner*—Stephen R. Funk
*Attorney, Agent, or Firm*—Mark A. Navarre

[57] ABSTRACT

A screen printing device for screen printing a thick film ink through a screen so as to form a highly-defined thick film on a surface of a microelectronics circuit. The screen printing device achieves the above by bypassing excess ink that would otherwise accumulate ahead of the squeegee device, thereby limiting the pressure lead length ahead of the device during the screen printing process. As such, the screen is able to form an adequate seal with the surface of the substrate to prevent ink from bleeding out under the screen, i.e., between the screen and substrate. The result is a well-defined thick film on the substrate, and avoids the necessity of stopping the printing operation in order to remove ink from the lower surface of the screen. The screen printing device enables a method by which well-defined films can be readily deposited at high throughput levels, without necessitating additional procedures, equipment and techniques that might otherwise further complicate the printing process.

2 Claims, 2 Drawing Sheets

SQUEEGEE DEVICE FOR SCREEN PRINTING PROCESSES

The present invention generally relates to devices and methods for screen printing a thick film ink onto a substrate of a microelectronics circuit. More particularly, this invention relates to an improved thick film printing device which is configured to enhance the definition of a thick film on a substrate by substantially preventing a thick film ink from being forced between the screen and substrate.

BACKGROUND OF THE INVENTION

As is well known in the art, thick film screen printing techniques are widely practiced for depositing a thick film paste, or ink, on a surface of a microelectronic circuit in order to form a thick film of various materials. Examples include dielectric, conductive and resistive thick film inks for forming dielectric layers, thick film conductors and thick film resistors, respectively, of a microcircuit. During the screen printing operation, a squeegee is used to force a thick film ink through openings in a screen and onto a substrate, which hereinafter will generically refer to the exposed surface of a microelectronics circuit being processed. The screen is typically constructed of stainless steel woven mesh, and has a photolithographically-defined pattern that determines the placement of the ink on the substrate. The inks used in screen printing processes usually are composed of an organic vehicle, glass frit, and active materials such as dielectric materials for insulating films, elemental metals or alloys for conductor films, or semiconductor compounds or alloys for resistor films. The flow characteristics, or rheology, of thick film inks can be generally described as pseudoplastic, in that the shear rate is very low at low stresses, but increases sharply once a sufficient stress is reached. As a result, the squeegee must be appropriately formed and its motion across the screen controlled, in order to maintain a constant angle of contact with the ink so that the force exerted on the ink is constant.

A conventional screen printing operation is depicted in FIGS. 1a and 1b, which illustrate a squeegee assembly 10 of a type known in the art. As illustrated, the assembly 10 includes an assembly holder 20, a blade 22 secured to and projecting downward from the assembly holder 20, and a squeegee member 24 affixed to the lower edge of the blade 22. The squeegee member 24 is typically molded from neoprene or polyurethane, and has the cross-sectional profile illustrated. Specifically, the squeegee member 24 has a working surface and an oppositely-disposed trailing surface, both of which are oriented to be at an angle of about forty-five degrees to the surface of a screen 12, which is suspended above a substrate 14 on which an ink 16 is to be printed. As shown in FIGS. 1a and 1b, the working surface faces and engages a quantity of ink 16 that has been flooded onto the surface of the screen 12.

Squeegee assemblies having the configuration of that depicted in FIGS. 1a and 1b are widely used, and ideally enable the simultaneous printing of numerous films with little sensitivity to the amount of ink 16 on the screen 12. However, as is apparent from FIG. 1b, as the assembly 10 travels across the screen 12, a large roll 18 of ink 16 accumulates in front of the squeegee member 24. The pressure lead length (the distance ahead of the squeegee member 24 where the ink 16 is subject to a sufficient amount of pressure to be forced through the screen 12 and onto the substrate 14) increases as the size of the roll 18 increases. If the pressure lead length becomes sufficiently large, the screen 12 is unable to form an adequate seal with the surface of the underlying substrate 14 to prevent ink 16 from being forced under the screen 12, i.e., "bleedout" between the screen 12 and substrate 14 occurs. The result is a significant or even total loss in thick film definition on the substrate 14, and necessitates that the printing operation be stopped and ink 16 removed from the lower surface of the screen 12.

In the prior art, a solution to the above has been to actively limit the size of the ink roll 18 as the squeegee assembly 10 traverses across the screen 12. Such techniques have included depositing a closely controlled amount of ink 16 on the screen 12, or continuously monitoring the size of the roll 18 in front of the assembly 10 in order to appropriately adjust the amount of ink 16 being deposited on the screen 12 ahead of the squeegee assembly 10. However, such techniques complicate the printing process and add considerable equipment cost.

Accordingly, what is needed is an improved squeegee assembly and a thick film printing process for using such an assembly, in which ink bleedout between the screen and substrate is substantially prevented, while avoiding the necessity of closely monitoring the size of the ink roll ahead of the squeegee assembly and controlling the amount of ink deposited on the screen.

SUMMARY OF THE INVENTION

It is an object of this invention to provide a screen printing device for screen printing a thick film ink through a screen so as to form a highly-defined thick film on a surface of a substrate.

It is another object of this invention that such a screen printing device is configured to minimize the size of the ink roll that develops in front of the device as it traverses the surface of the screen.

It is yet another object of this invention that such a screen printing device is configured to force through the screen only the amount of ink necessary to form the desired thick film on the circuit, so as to avoid ink bleedout beneath the screen.

It is a further object of this invention that such a screen printing device is configured to enable excess thick film ink to be removed from the screen at the front of the device, and then accumulated and/or transferred rearward to be redeposited on the screen behind the device.

It is yet a further object of this invention to provide an improved screen printing process capable of producing a highly-defined thick film on a surface of a substrate.

In accordance with a preferred embodiment of this invention, these and other objects and advantages are accomplished as follows.

According to the present invention, there is provided a screen printing device for screen printing a thick film ink through a screen so as to form a highly-defined thick film on a surface of a substrate. The screen printing device enables a method by which well-defined films can be readily deposited at high throughput levels, without necessitating additional procedures, equipment and techniques that might otherwise further complicate the printing process. The screen printing device achieves the above by controlling the size of the ink roll ahead of the device, thereby limiting the pressure lead length ahead of the device during the screen printing process. As such, the screen is able to form an adequate seal with the surface of the substrate to prevent ink from bleeding out under the screen, i.e., between the screen and substrate. The result is a well-defined thick film on the substrate, and avoids the necessity of stopping the printing operation in order to remove excess ink from the lower surface of the screen.

Generally, the screen printing device of this invention includes a squeegee member having a forward portion adapted to force a portion of thick film ink through openings in a screen and onto an underlying substrate as the squeegee member is traversed across the surface of the screen. The device further includes a support for the squeegee member, which positions the squeegee member as it traverses the screen surface. Finally, the support is adapted to remove that portion of the ink that was not deposited onto the substrate, and then accumulate the excess ink and/or transfer and redeposit the ink onto the screen rearward of the support as the squeegee member traverses across the screen. In a preferred embodiment, rearward transfer of the ink to the screen entails lifting any excess thick film ink from the screen, flowing the ink over the squeegee member and through apertures formed in the support, and then redepositing the ink on the screen rearward of the support. As a result of excess thick film ink being continuously removed from the front of the squeegee member, the size of the ink roll ahead of the squeegee member never achieves a size that will cause bleedout of the ink between the screen and substrate. As such, the device of this invention significantly enhances the ability to print well-defined thick films on the surface of a substrate.

From the above, it can be appreciated that the screen printing process made possible by the device of this invention is uncomplicated. The process is generally conventional to the extent that it involves supporting and traversing the squeegee member across the surface of the screen, such that a forward portion of the squeegee member forces a portion of the thick film ink through the screen openings and onto the substrate. A key aspect of the process is the continuous removal of a portion of the thick film ink at the forward portion of the squeegee member. In a preferred embodiment, the portion of the ink deposited on the substrate and the portion removed from the screen are apportioned to prevent bleedout by configuring the squeegee member to have a leading edge that is disposed above the surface of the screen when the squeegee member is in position for printing. During printing, the leading edge of the squeegee member causes the thick film ink between the edge and the screen surface to be forced through the screen, while the remaining thick film ink (that generally disposed above the edge) is lifted from the screen and transferred rearwardly, at which point it is either accumulated or immediately redeposited on the screen rearward of the squeegee member.

Accordingly, a significant advantage of this invention is that the screen printing device enables a thick film screen printing process in which well-defined thick films can be readily deposited at high throughput levels. Specifically, ink bleedout between the screen and substrate is avoided by preventing a large ink roll ahead of the squeegee member, such that the width of the resulting thick film deposited on the substrate more closely corresponds to the width of the openings in the screen through which the ink was printed. Furthermore, the screen printing device of this invention eliminates the prior art requirement to closely control the amount of ink deposited on the screen and the size of the ink roll ahead of the squeegee assembly through the use of additional monitoring equipment.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 2A:
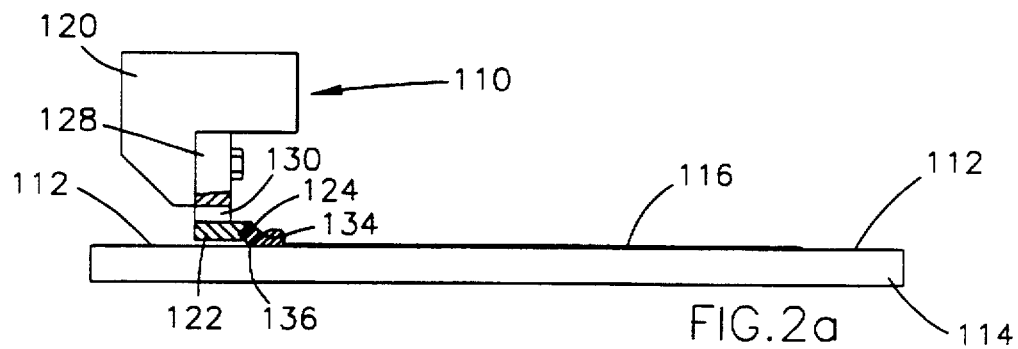
FIGS. 2a–2c schematically represent the use of a screen printing device in accordance with a preferred embodiment of this invention.
Figure 2B:
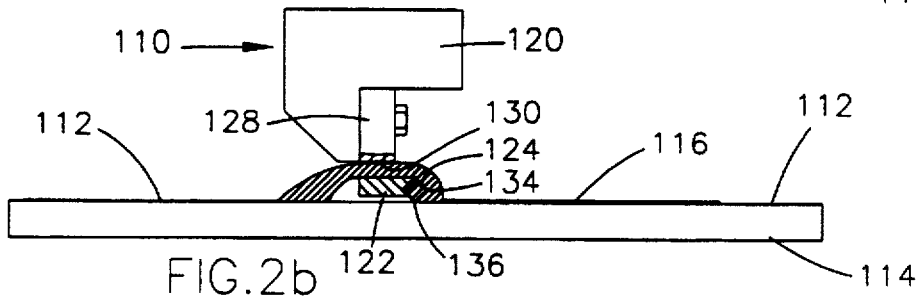
Figure 2C:
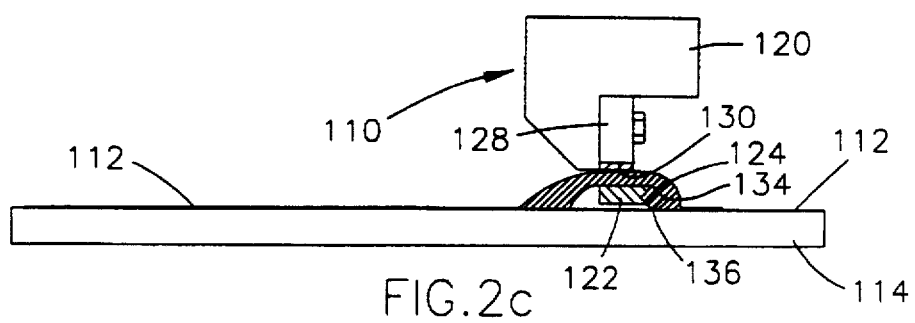

Illustrated in FIGS. 2a–2c and 3 is an improved screen printing assembly 110 for screen printing a thick film ink 116 onto a substrate 114, such as a microelectronics circuit, in order to form a thick film on the substrate 114. As shown in FIGS. 2a through 2c, use of the assembly 110 of this invention prevents the buildup of a large volume, or roll, of thick film ink 116 on the screen 112 ahead of the assembly 110 during the screen printing operation by channeling excess ink 116 rearwardly. The assembly 110 can be adapted to accumulate a portion or all of the excess ink 116, or immediately redeposit the excess ink 116 on the screen 112 behind the assembly 110 as it traverses the screen 112. In so doing, the pressure lead length ahead of the assembly 110 is limited to the extent that the screen 112 is able to maintain an adequate seal with the surface of the substrate 114, preventing ink 116 from bleeding out under the screen 112, i.e., between the screen 112 and substrate 114. The result is a well-defined thick film on the substrate 114, and avoids the necessity of stopping the printing operation in order to remove ink 116 from the lower surface of the screen 112.

Figure 3:
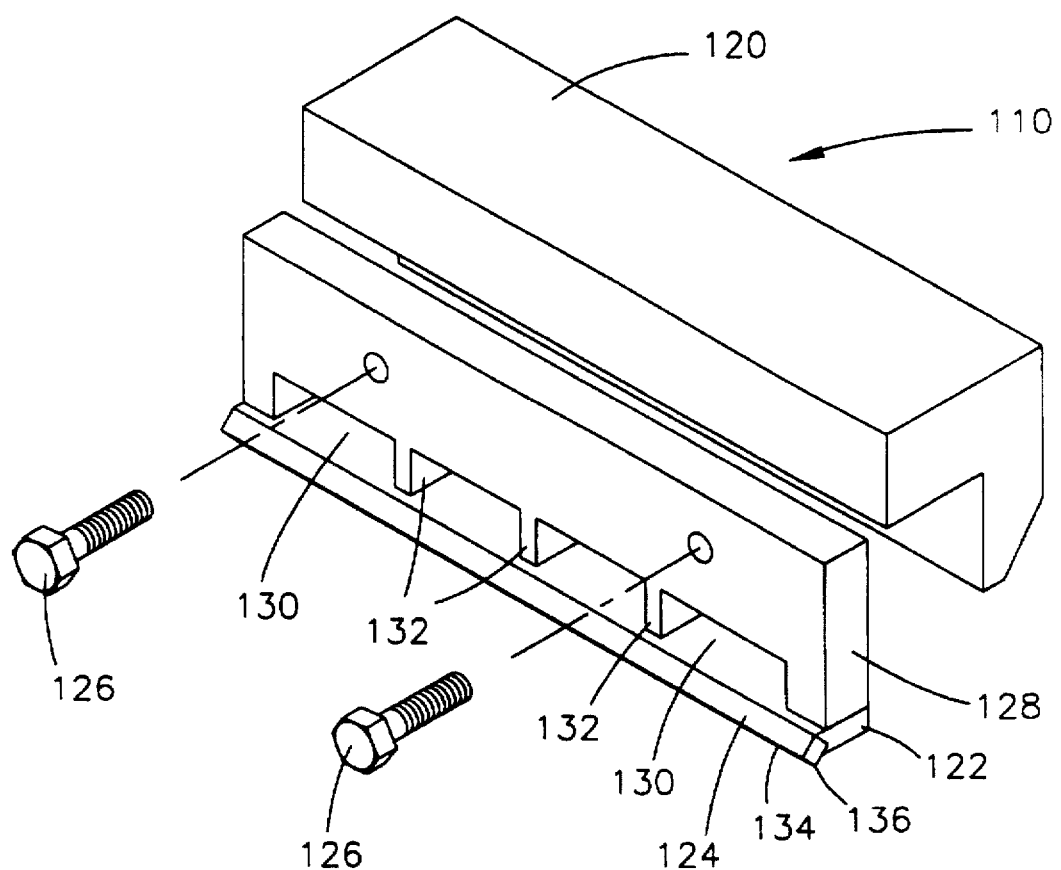
FIG. 3 is a perspective view of the screen printing device of FIGS. 2a–2c.

As shown in FIG. 3, the assembly 110 of this invention is generally elongate, composed of a blade 122 attached to the lower surface of a mount 128, and a squeegee member 124 attached to a forward portion of the blade 122. The mount 128 is secured with fasteners 126 to an assembly holder 120, which is configured to be mounted on equipment capable of stroking the assembly 110 across the surface of the screen 112. In order to provide adequate support for the squeegee member 124, the blade 122 and mount 128 are both preferably formed from rigid materials. A preferred material for the blade 122 is a tool steel so as to provide the stiffness required for maintaining a uniform force between the squeegee member 124 and the screen 112 along the entire length of the squeegee member 124 during printing. A suitable material for the mount 128 can be a relatively lightweight metal such as an aluminum alloy, though other suitably rigid materials could be used. A preferred geometry for the blade 122 provides a lower surface that is approximately parallel to the upper surface of the screen 112, with a notch or recess formed in its forward surface to receive the squeegee member 124.

The squeegee member 124 is preferably formed from a material which is sufficiently pliable to effectively form a seal against the screen 112 during printing, yet exhibits sufficient rigidity in order to endure the dynamic forces imposed on the assembly 110 during the printing process. A preferred material is polyurethane having a Shore A hardness of about 30 to about 80, though it is foreseeable that other polymeric materials such as neoprene could be used. Generally, the squeegee member 124 can be molded directly to the blade 122 in order to form a suitable bond therebetween, though it is foreseeable that an adhesive could be used for this purpose.

The squeegee member 124 is shown to have a square-shaped cross-section, although other shapes could be used.

Preferably, the squeegee member 124 is formed to have two intersecting surfaces opposite the blade 122. A lower working surface is disposed at an angle to the surface of the screen 112, while an adjoining upper surface intersects the working surface to form a forward-facing leading edge 134 with the working surface. The working surface also forms a working edge 136 spaced apart from the leading edge 134, with the working surface and its working edge 136 cooperating to force the thick film ink 116 through the screen 112 during the printing operation. The leading edge 134 is positioned on the squeegee member 124 such that, when the assembly 110 is in position over the screen 112 as shown in FIGS. 2a–2c, the edge 134 is disposed above the surface of the screen 112. In this manner, the edge 134 serves to separate the ink 116 on the screen 112 as the assembly 110 traverses the surface of the screen 112, with ink 116 disposed below the edge 134 (between the edge 134 and the surface of the screen 112) being forced into openings in the screen 112, while the remainder is lifted off the screen 112 by the depending surface of the squeegee disposed above and behind the leading edge 134.

The ability for the squeegee member 124 to separate the quantity of ink 116 into two separate portions is advantageous when taken with the preferred configurations for the blade 122 and mount 128. In particular, the mount 128 is shown in FIG. 3 as including a number of apertures 130 formed at its lower end by struts 132 that project downwardly and engage the upper surface of the blade 122. As shown, the struts 132 are spaced apart along a widthwise direction of the mount 128, and each adjacent pair of struts 132 is spaced apart a distance greater than the width of each strut 132, such that the apertures 130 are of sufficient size to accommodate high flow levels of ink 116 through the mount 128. The blade 122 has a low profile that serves as a lead-in to the apertures 130 in the mount 128, and provides a sizable platform on which ink 116 can be accumulated. As such, the portion of ink 116 that is lifted from the screen 112 with the squeegee member 124 can be channeled over the blade 122 and accumulated on the blade 122. Depending on the rate at which the squeegee member 124 is traversed across the screen 112, the size of the blade 122 and the amount of ink 116 deposited on the screen 112, the excess ink 116 can be either entirely accumulated on the blade 122, partially accumulated on the blade 122 with excess ink 116 being forced rearwardly through the apertures 130 and then redeposited onto the screen 112 rearward of the blade 122, or immediately channeled through the apertures 130 and redeposited on the surface of the screen 112 behind the blade 122 as shown in FIGS. 2a–2c. If the excess ink 116 is accumulated on the blade 122, the ink 116 can be transferred back to the screen 112 before the screen 112 is again flooded with additional ink 116 prior to the next print cycle.

In use, and as illustrated in FIGS. 2a–2c, the assembly 110 of this invention is supported with the assembly holder 120 and forced across the surface of the screen 112 positioned over the surface of the substrate 114. As shown, the assembly 110 is fixtured with the assembly holder 120 such that the working surface of the squeegee member 124 faces the direction of travel of the assembly 110 as it travels across the surface of the screen 112. As such, the working surface and the working edge 136 will act to force the thick film ink 116 through the screen 112, with these forces developing within the region between the leading edge 134 and the screen 112. A quantity of thick film ink 116, such as a dielectric, conductive or resistive thick film ink composition, is deposited on the screen 112, which is typically supported above the substrate 114, and the working edge 136 is brought into contact with the screen 112. The assembly 110 is then moved across the screen 112 so as to print the thick film ink 116 through openings (not shown) in the screen 112, thereby forming a thick film on the underlying substrate 114.

As the assembly 110 moves across the surface of the screen 112, the size of the ink roll ahead of the squeegee member 124 is limited to a small size by channeling any excess ink 116 on the screen 112 away from the screen 112 at the point where the ink 116 is being forced through the screen 112. In this manner, the size of the ink roll is minimized to the extent that the pressure lead length is sufficiently reduced to avoid bleedout of the ink 116 beneath the screen 112.

Figure 1A:
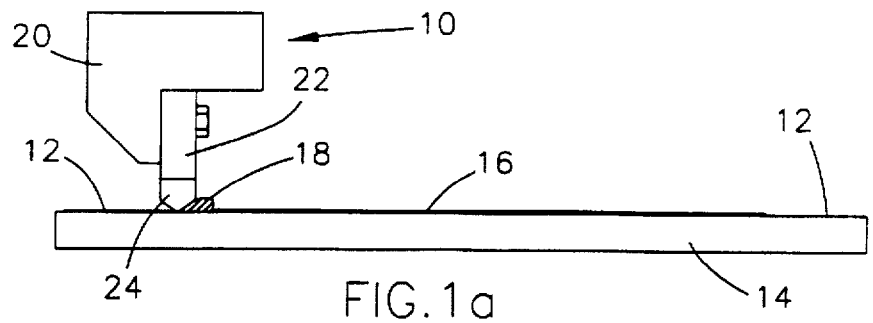
FIGS. 1a and 1b schematically represent the use of a screen printing device configured in accordance with the prior art.
Figure 1B:
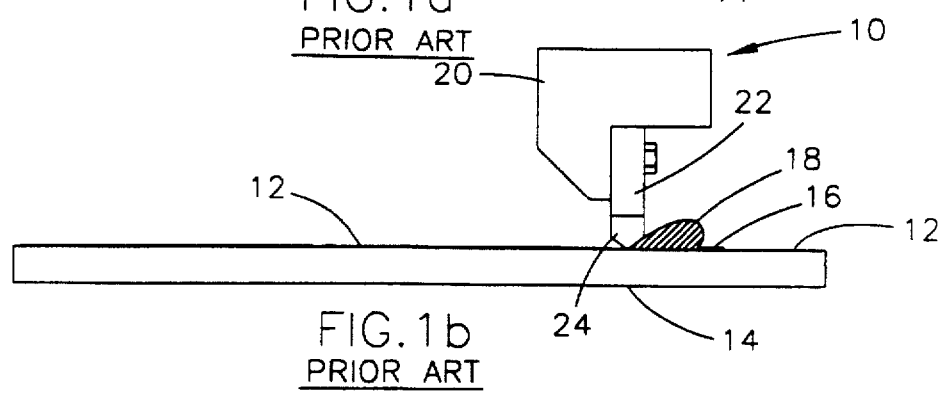

To verify the above, the assembly 110 of this invention and the prior art assembly 10 illustrated in FIGS. 1a–1b were used to print thick film conductor ink compositions through screens with openings having a nominal size of either 0.1 or 0.5 millimeter (0.004 and 0.020 inch, respectively). The inks were compositions available from E.I. DuPont de Nemours and Company, Inc., of Wilmington, Del., under the product designations QS179 and 7474. The QS179 ink has a relatively high viscosity that tends to reduce bleedout problems, but which can cause other complications or limit its usefulness for some applications. In contrast, the 7474 ink has a relatively low viscosity, which makes this ink susceptible to bleedout during screen printing. A total of twenty printing cycles was completed for each combination of screen and ink in order to evaluate the tendency for ink to build up and eventually cause ink bleedout between the screen and an underlying substrate. The assemblies 10 and 110 were configured such that their squeegee members 24 and 124, respectively, presented similarly oriented working surfaces to the ink during printing.

In a first series of tests conducted with the 7474 ink and a screen having 0.1 mm openings, the assembly 110 of this invention produced thick films whose widths remained nearly constant, with a width of about 123 micrometers formed during the first cycle and a width of about 121 micrometers formed during the final (20th) cycle. In contrast, the prior art assembly 10 produced thick films whose widths, though nearly constant, were on the order of about 156 to about 159 micrometers, i.e., a much poorer line definition indicative of ink bleedout beneath the screen.

In a second series of tests, again conducted with the 7474 ink but with the screen having 0.5 mm openings, the assembly 110 of this invention again produced thick films whose widths remained nearly constant, with a width of about 546 micrometers formed during the first and final cycles. In contrast, the prior art assembly 10 produced films whose widths were originally about 541 micrometers, but rapidly increased to a final width of about 569 micrometers. This increase is typical for prior art printing devices using low viscosity inks, and is indicative of accumulation of ink on the screen surface resulting in a greater degree of ink bleedout with each print cycle.

A third series of tests was then conducted with the QS179 ink and the screen having 0.1 mm openings. In these tests, the assembly 110 of this invention produced thick films whose widths increased slightly, but remained well defined, on the order of about 113 micrometers during the first cycle and about 125 micrometers during the final (20th) cycle. In contrast, the prior art assembly 10 produced much wider thick films, on the order of about 140 to about 149 micrometers—again a much poorer line definition indicative of ink bleedout beneath the screen.

A fourth and final series of tests were conducted with the QS179 ink, but with the screen having 0.5 mm openings.

Again, the assembly 110 of this invention produced thick films whose widths remained nearly constant, on the order of about 523 micrometers during the first cycle and about 533 micrometers during the final cycle. In contrast, the prior art assembly 10 produced thick films whose widths remained well above that produced by the assembly 10, on the order of about 572 micrometers and indicative of a significant degree of ink bleedout.

From the above tests, it can be readily appreciated that under identical processing conditions, the assembly 110 of this invention produced better-defined thick films than was possible with the assembly 10 of the prior art. Accordingly, this invention provides a screen printing device that enables a method by which well-defined films can be readily deposited at high throughput levels, without necessitating additional procedures, equipment and techniques that might otherwise further complicate the printing process.

While our invention has been described in terms of a preferred embodiment, it is apparent that other forms could be adopted by one skilled in the art; for example, by forming the squeegee member 124 to have a cross-sectional profile that differs from that portrayed in the FIGS., or by altering the shape or construction of the blade 122 and/or mount 128, or by substituting appropriate materials. Accordingly, the scope of our invention is to be limited only by the following claims.

We claim:

1. A screen printing device for printing thick film ink through a screen and onto a substrate, said device comprising:

a holder positioned over said screen, and adapted to be linearly displaced relative to said screen;

a mounting element fastened to said holder for displacement therewith, including multiple strut members extending away from said holder in the direction of said screen;

a longitudinally extending blade member formed of a high stiffness material and fastened to ends of said strut members in proximity to a surface of said screen to provide a stiff support structure in proximity to said screen; and a longitudinally extending squeegee fastened along its length to a forward surface of said blade member, said squeegee having a longitudinally extending working surface that forces a portion of said thick film ink through said screen and onto said substrate when said squeegee is linearly displaced with said holder, said working surface being bounded by a working edge that engages said surface of said screen and a leading edge that, together with a depending surface above said leading edge, lifts a surplus portion of said thick film ink off of said screen and through apertures defined by said blade member and the strut members of said mounting element.

2. A screen printing device for a process in which thick film ink is deposited onto a screen, and a longitudinally extending squeegee fastened to a movable holder is wiped across a surface of said screen to force a portion of said thick film ink through said screen and onto a substrate underlying said screen, the improvement wherein:

said holder comprises a longitudinally extending mounting element having along its longitudinal dimension multiple strut members extending toward said screen, and a blade member formed of a high stiffness material and fastened to ends of said strut members in proximity to the surface of said screen to provide a stiff longitudinally extending holder element in proximity to said screen; and said squeegee is fastened along its entire length to a forward surface of said blade member, said squeegee having a longitudinally extending leading edge disposed above the surface of said screen that, together with a depending surface above said leading edge, lifts a surplus portion of said thick film ink off of said screen and through apertures defined by said blade member and the strut members of said mounting element.

* * * * *